(12) United States Patent
Ning et al.

(10) Patent No.: US 8,044,398 B2
(45) Date of Patent: Oct. 25, 2011

(54) DISPLAY SUBSTRATE

(75) Inventors: Hong-Long Ning, Suwon-si (KR);
Chang-Oh Jeong, Suwon-si (KR);
Je-Hun Lee, Seoul (KR); Yang-Ho Bae,
Seoul (KR); Pil-Sang Yun, Seoul (KR);
Hong-Sick Park, Suwon-si (KR);
Joo-Ae Youn, Seongnam-si (KR);
Byeong-Beom Kim, Suwon-si (KR);
Byeong-Jin Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 401 days.

(21) Appl. No.: 12/331,138

(22) Filed: Dec. 9, 2008

(65) Prior Publication Data
US 2009/0179203 A1 Jul. 16, 2009

(30) Foreign Application Priority Data
Jan. 15, 2008 (KR) .................. 10-2008-0004401

(51) Int. Cl.
H01L 29/04 (2006.01)
H01L 29/15 (2006.01)
H01L 27/01 (2006.01)
H01L 27/12 (2006.01)

(52) U.S. Cl. ...... 257/59; 257/72; 257/350; 257/E29.151
(58) Field of Classification Search .................. 257/59, 257/72, 350, E29.151
See application file for complete search history.

(56) References Cited

U.S. PATENT DOCUMENTS

| 7,744,719 | B2 * | 6/2010 | Kim et al. | 156/295 |
| 2006/0274231 | A1 * | 12/2006 | Kwon et al. | 349/106 |
| 2006/0274236 | A1 * | 12/2006 | Chai et al. | 349/111 |
| 2007/0131927 | A1 * | 6/2007 | Kawakami et al. | 257/40 |

* cited by examiner

Primary Examiner — Ngan Ngo
(74) Attorney, Agent, or Firm — Innovation Counsel LLP

(57) ABSTRACT

A display substrate includes an insulating substrate, a thin-film transistor (TFT), a pixel electrode, a signal line and a pad part. The insulating substrate has a display region and a peripheral region surrounding the display region. The TFT is in the display region of the insulating substrate. The pixel electrode is in the display region of the insulating substrate and electrically connected to the TFT. The signal line is on the insulating substrate and extends from the peripheral region toward the display region. The pad part is in the peripheral region and electrically connects to the signal line. The pad part is formed in a trench of the insulating substrate and includes a region that extends into the insulating substrate. Therefore, the signal line may be securely attached to the insulating substrate.

13 Claims, 8 Drawing Sheets

DISPLAY SUBSTRATE

CROSS-REFERENCE TO RELATED APPLICATIONS

The present application claims priority under 35 U.S.C. §119 to Korean Patent Application No. 2008-4401, filed on Jan. 15, 2008 in the Korean Intellectual Property Office (KIPO), the contents of which are herein incorporated by reference in their entirety.

BACKGROUND OF THE INVENTION

1. Field of the Invention

The present invention relates to a display substrate. More particularly, the present invention relates to a display substrate used for a flat panel display device.

2. Description of the Related Art

A liquid crystal display (LCD) device, which is a type of display device, generally includes a display substrate, a color filter substrate facing the display substrate and a liquid crystal layer interposed between the display substrate and the color filter substrate.

The display substrate includes a signal line, a thin-film transistor (TFT), a pixel electrode, etc., that are formed on an insulating substrate to independently drive a plurality of pixels. The color filter substrate includes a color filter layer, a common electrode, etc. The color filter layer includes red (R), green (G) and blue (B) color filters, and the common electrode faces the pixel electrode.

When a screen size of the LCD panel is increased, a length of the signal line is increased. Also, when a resolution of the LCD panel is increased, a width of the signal line is decreased. Thus, resistance of the signal line is increased, and intensity of signals transmitted through the signal line is decreased. Also, the signals may be delayed. In order to solve the above-mentioned problems, the signal line includes a low resistance material such as copper.

The signal line including copper may be formed through a damascene process. In the damascene process, a trench is formed on a base substrate, and the copper is plated in the trench. However, a gas that is generated during copper plating may cause the signal line to be lifted off from the base substrate, thereby deteriorating stability of the signal line.

SUMMARY OF THE INVENTION

The present invention provides a display substrate capable of easily discharging gas to prevent lifting off of a line pattern and increasing stability of the line pattern.

A display substrate in accordance with one aspect of the present invention includes an insulating substrate, a thin-film transistor (TFT), a pixel electrode, a signal line and a pad part. The insulating substrate has a display region and a peripheral region surrounding the display region. The TFT is in the display region of the insulating substrate. The pixel electrode is in the display region of the insulating substrate and electrically connected to the TFT. The signal line is on the insulating substrate and extends from the peripheral region toward the display region. The pad part is in the peripheral region and electrically connects to the signal line. The pad part is formed in a trench of the insulating substrate and includes a region that extends into the insulating substrate, the region being defined by a contour line.

The region may have a slit shape or an island shape.

The slit may extend in a direction substantially parallel to the signal line.

The display substrate may further include a guard ring formed in the peripheral region and electrically connected to the signal line, and the guard ring may include a region that exposes the insulating substrate.

The guard ring may be formed from the same layer as the pad part.

The guard ring may be disposed on a side opposite to the pad part with respect to the signal line.

A distance between an outer side of the guard ring and the contour line may be no more than about 200 µm.

A display substrate in accordance with another aspect of the present invention includes a base substrate, a first line layer, an insulating layer, a second layer, a TFT and a pixel electrode. The base substrate includes a trench pattern formed between a first contour line and at least one second contour line formed in the first contour line. The first line layer is in the trench pattern of the base substrate. The insulating layer is on the base substrate having the first line layer to cover the first line layer. The second line layer is on the insulating layer. The TFT is on the base substrate and electrically connected to the first line layer and the second line layer. The pixel electrode is on the base substrate and electrically connected to the TFT.

The first line layer may include copper, silver or an alloy thereof.

The first line layer may include a seed layer on an inner surface of the trench, and a conductive layer on the seed layer.

The seed layer may include at least one selected from the group consisting of copper (Cu), molybdenum (Mo), titanium (Ti), titanium oxide (TiO), tantalum (Ta), an oxide thereof and a nitride thereof.

The first line layer may include a gate pad in a peripheral region of the base substrate and a gate line electrically connected to the gate pad, and the second line layer includes a source pad in the peripheral region and a source line electrically connected to the source pad.

The first line layer may be opposite to the gate pad, and may further include a guard ring electrically connected to a plurality of gate lines.

A distance between the first contour line and the second contour line may be no more than about 200 µm.

A depth of the trench may be no more than about 5,000 Å.

A plurality of second contour lines having a plurality of slit shapes arranged substantially in parallel with each other may be formed in the first contour line defining the gate pad, and the slit shapes may expose the base substrate.

A width of each of the second contours defining the slit shapes may be about 20 µm, and a distance between adjacent second contours may be about 40 µm.

The first line layer may include a source pad in the peripheral region, and the second line layer includes a gate pad in the peripheral region.

The first contour line may define a shape of the source pad, and the second contour line may be extended in a direction substantially parallel with the source line and expose the base substrate in the source pad along the source line.

A width of each of the second contour lines may be about 20 µm, and a distance between adjacent second contour lines may be about 40 µm.

According to the present invention, gas generated during forming of a line pattern may be easily discharged to prevent lifting off of the line pattern from a substrate and to increasing a contact area between the line pattern and the substrate to improve stability of the line pattern.

In another embodiment of the present invention, a method for constructing conductive lines in a display substrate is disclosed wherein said method comprising: depositing a photoresist layer on a display substrate; illuminating said photoresist layer with a mask, said mask comprising a trench mask structure and an island mask region, said island mask region contained within said trench mask structure; etching display substrate to create a trench structure and an island structure within said trench structure upon said display substrate; and forming a conductive layer within said trench structure.

Forming a conductive layer within said trench structure may further comprise forming a seed layer within said trench structure and forming a metal layer upon said seed layer.

Forming a conductive layer within said trench structure may further comprise depositing a conductive layer, said depositing step comprising an ELP process; and exhausting gases generated by said depositing step along the side of said trench structure.

In yet another embodiment of the present invention, an exposure mask is disclosed comprising a transparent substrate; a reticle formed on the transparent substrate, said reticle further comprising a first mask portion wherein said first mask portion comprises a first contour line defining a corresponding metal region on a device substrate when said device substrate is illuminated by light through said exposure mask; and a second contour line defining a corresponding island region within metal region on a device substrate when said device substrate is illuminated by light through said exposure mask.

The exposure mask may further comprise a first contour region that defines a corresponding metal line on said device substrate and a second contour region that defines a corresponding island region that runs substantially parallel to said corresponding island region.

The exposure mask may further comprise a second contour region comprising a second width, said second width being less than the distance between the first contour region and second contour region.

In yet another embodiment of the present invention, a method of manufacturing an electronic device is disclosed, said method comprising: forming a film over a substrate; forming a photoresist over the film; performing an exposure by using an exposure mask, said exposure mask comprising: a transparent substrate; a reticle formed on the transparent substrate, said reticle further comprising a first mask portion wherein said first mask portion comprises: a first contour line defining a corresponding metal region on a device substrate when said device substrate is illuminated by light through said exposure mask; and a second contour line defining a corresponding island region within metal region on a device substrate when said device substrate is illuminated by light through said exposure mask.

This method may further comprises a first contour region that defines a corresponding metal line on said device substrate and a second contour region that defines a corresponding island region that runs substantially parallel to said corresponding island region.

This method may further comprise a second contour region that comprises a second width, said second width being less than the distance between the first contour region and second contour region.

BRIEF DESCRIPTION OF THE DRAWINGS

The above and other advantages of the present invention will become more apparent by describing in detail example embodiments thereof with reference to the accompanying drawings, in which.

DESCRIPTION OF THE EMBODIMENTS

Figure 1:
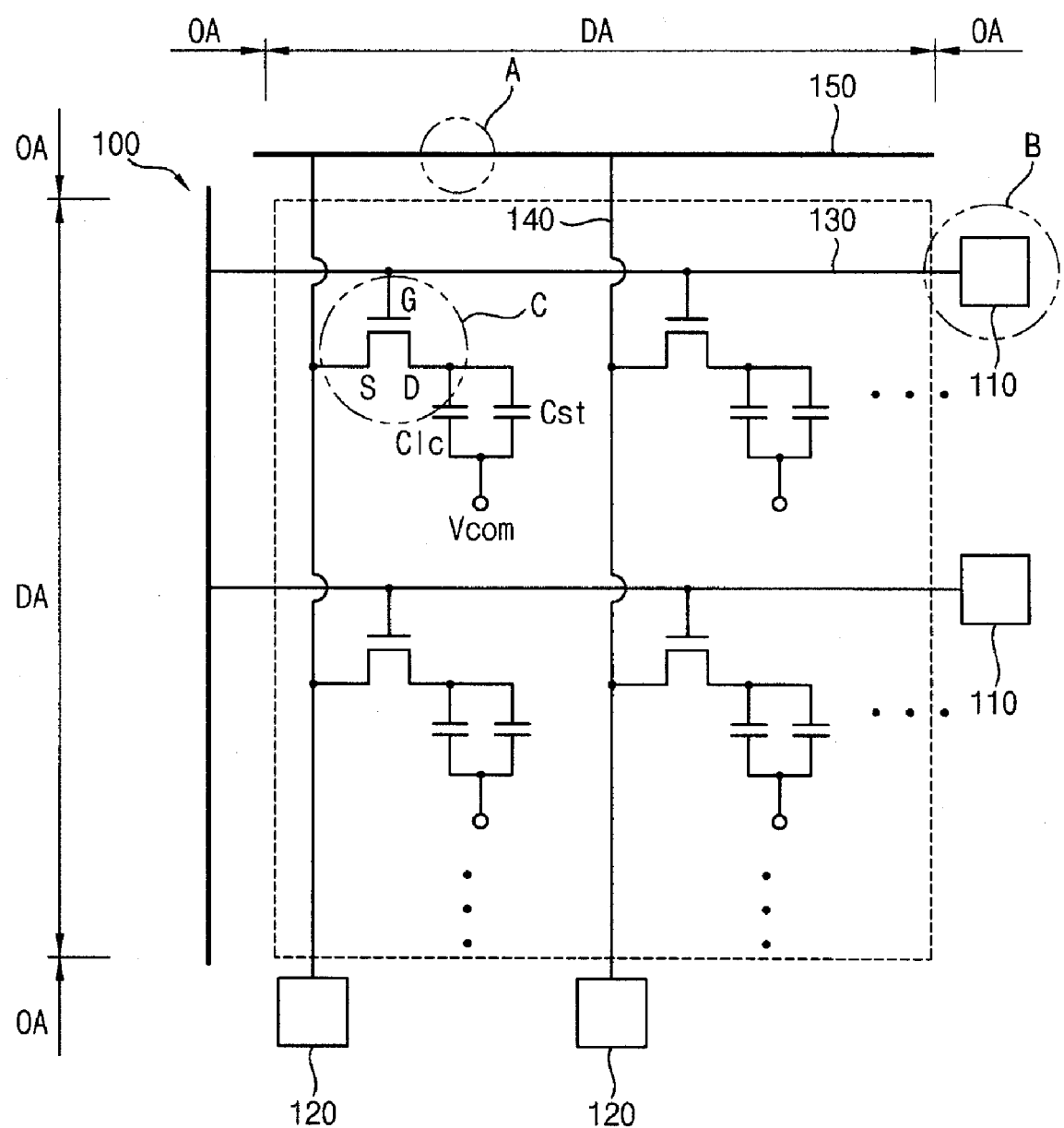
FIG. 1 is a plan view illustrating a liquid crystal display (LCD) panel in accordance with one embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view illustrating a liquid crystal display (LCD) panel in accordance with one embodiment of the present invention.

Referring to FIG. 1, the LCD panel 100 may, in one exemplary embodiment, have a display region DA and a peripheral region OA surrounding the display region DA. A plurality of pixels may be arranged in a matrix shape in the display region DA as shown in FIG. 1 or in any other fashion as is known in the art. For example, a gate line 130 and a source line 140 may be formed in the display region DA.

Each of the pixels includes a switching element TFT electrically connected to the gate and source lines 130 and 140, a liquid crystal capacitor Clc electrically connected to the switching element TFT, and a storage capacitor Cst electrically connected to the liquid crystal capacitor Clc, in parallel.

The switching element TFT includes a gate electrode G, a source electrode S and a drain electrode D. The gate electrode G is electrically connected to the gate line 130. The source electrode S is electrically connected to the source line 140. The drain electrode D is spaced apart from the source electrode S and is electrically connected to the liquid crystal capacitor Clc and the storage capacitor Cst.

A gate pad 110 connected to an external device is electrically connected to an end portion of the gate line 130 to receive a gate signal from the external device. A source pad 120 is electrically connected to an end portion of the source line 140 to receive a source signal that is externally provided. The gate pad 110 and the source pad 120 are disposed in the peripheral region OA.

When the gate voltage is applied to the gate line 130, the switching element TFT electrically connected to the gate line 130 is turned on, so that a pixel voltage that is transmitted from the source line 140 is applied to the liquid crystal capacitor Clc. An arrangement of liquid crystals interposed between a pixel electrode (not shown) and a common electrode (not shown) of the liquid crystal capacitor Clc is varied in response to an electric field formed by the pixel voltage, and light transmittance of the liquid crystal layer is changed to display an image.

For example, a plurality of the LCD panels 100 may be formed on a single mother substrate, and are cutted so that the LCD panels 100 are separated from each other. A guard ring 150 electrically connected to the gate and source lines 130 and 140 may be formed on the LCD panels 100 to ground the gate and source lines 130 and 140, thereby protecting the LCD panel 100 from a static charge that is generated during manufacturing the LCD panels 100. In FIG. 1, the LCD panel 100 includes the guard ring 150. The guard ring 150 may be removed from the LCD panel 100 by the cutting of the LCD panels 100. The guard ring 150 is disposed in the peripheral region OA. A line structure of the LCD panel 100 will be described as follows.

Figure 2:
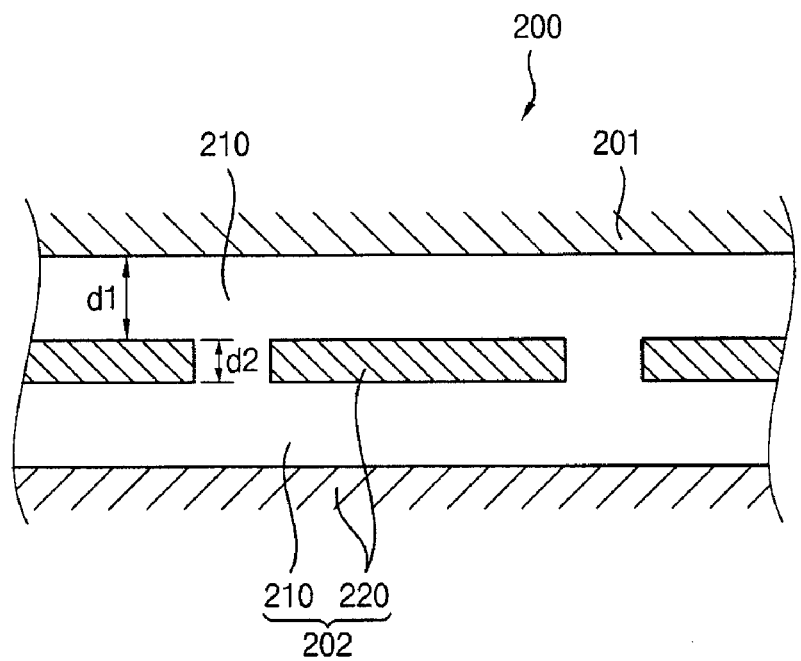
FIG. 2 is a plan view illustrating a mask in accordance with one embodiment of the present invention.

FIG. 2 is a plan view illustrating a mask in accordance with one embodiment of the present invention.

Referring to FIG. 2, the mask 200 includes a transparent substrate 201 and a reticle 202 on the transparent substrate 201. The reticle 202 includes a first portion 210 corresponding to a line pattern of the LCD panel 100 and a second portion 220 corresponding to a remainder of the LCD panel 100. For example, the first portion 210 of the reticle 202 corresponds to a metal pattern of the LCD panel 100, and the second portion 220 of the reticle 202 does not correspond to the metal pattern.

One of the first and second portions 210 and 220 of the reticle 202 transmits light, and the other of the first and second portions 210 and 220 of the reticle 202 blocks light. The light transmittance between the first and second portions 210 and 220 is determined by a photoresist film 111 (for example, see FIGS. 11A, 11B, and 11C) such as a positive type photoresist film or a negative type photoresist film.

In one embodiment, a width d2 of an inner part of the second portion 220, which is surrounded by the first portion 210, is about 20 μm. The distance d1 between the inner part of the second portion 220 and an outer part of the second portion 220, which is formed outside of the first portion 210, is about 40 μm.

Figure 3:
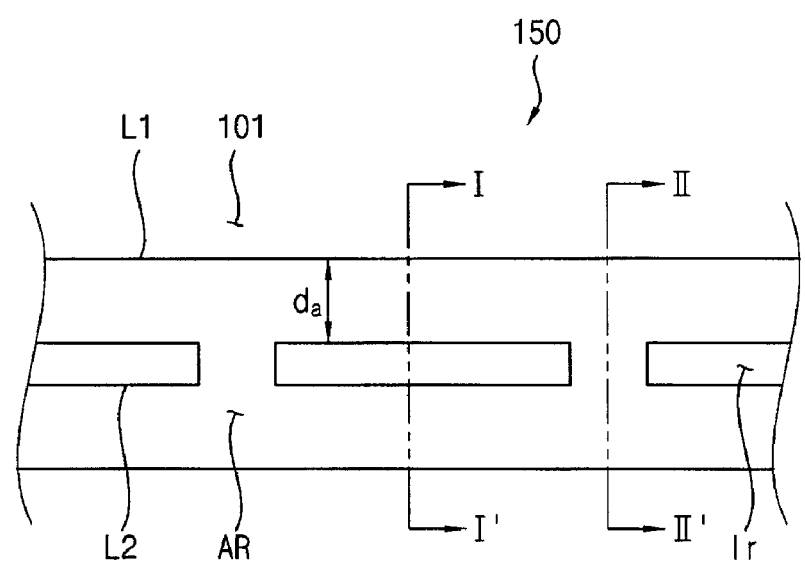
FIG. 3 is a plan view illustrating a guard ring formed in a portion 'A' of FIG. 1 using the mask shown in FIG. 2.

FIG. 3 is a plan view illustrating a guard ring formed in a portion 'A' of FIG. 1 using the mask shown in FIG. 2.

Referring to FIG. 3, the guard ring 150 is formed in a region AR between a first contour line L1 and a second contour line L2 that is disposed in the region defined by the first contour line L1.

It will be understood that the contour line of the present invention is referred to as being a closed loop or an open loop whose ends are connected to a side of a substrate. A contour line defines a region.

In FIG. 3, a distance da between an outline of the guard ring 150 and an edge of an island Ir formed by the second contour L2 may be no more than about 200 μm. For example, the distance da between the outline of the guard ring 150 and the edge of the island Ir formed by the second contour L2 may be between about 100 μm to about 150 μm. Alternatively, when the guard ring does not have the island and the width of the guard ring and the depth of the trench are about 300 μm and 5,000 Å, respectively, the metal pattern is lifted off from the substrate 101.

Figure 4:
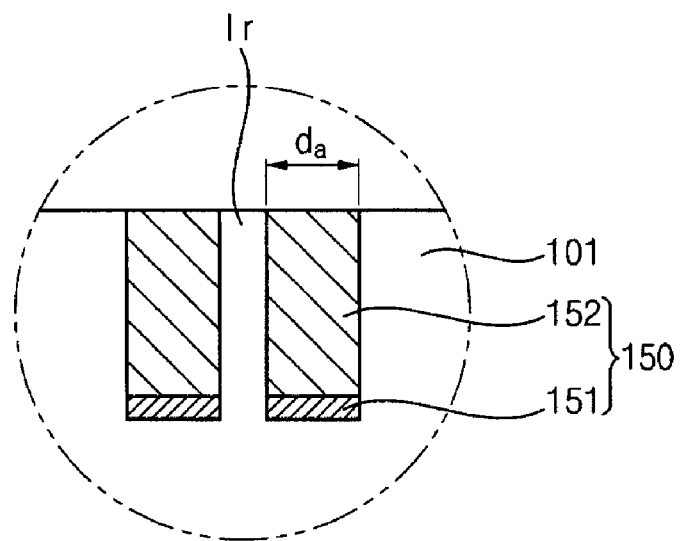
FIG. 4 is a cross-sectional view taken along a line I-I' shown in FIG. 3.
Figure 5:
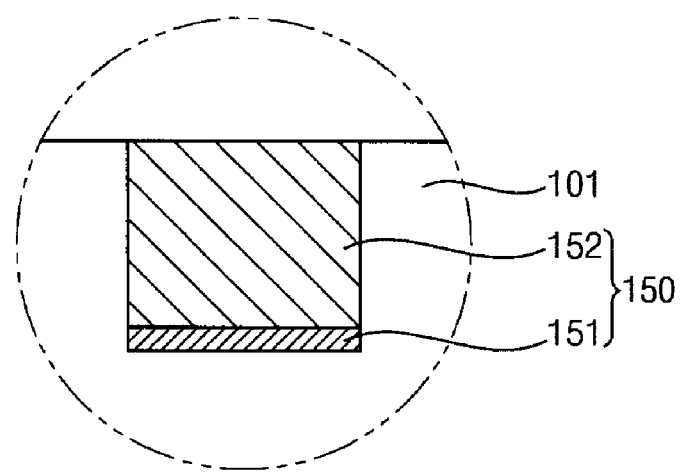
FIG. 5 is a cross-sectional view taken along a line II-II' shown in FIG. 3.

FIG. 4 is a cross-sectional view taken along a line I-I' shown in FIG. 3. FIG. 5 is a cross-sectional view taken along a line II-II' shown in FIG. 3.

Referring to FIGS. 4 and 5, the guard ring 150 is formed in the trench formed on the base substrate 101. The depth of the trench may be no more than about 5,000 Å.

The guard ring 150 includes a seed layer 151 and a conductive layer 152. The seed layer 151 is used for plating the conductive layer 152 through an electroless plating (ELP) method. The conductive layer 152 may include a high conductive material. Examples of the high conductive material that may be used for the conductive layer 152 include copper, silver, an alloy thereof, etc. Thus, although the length of the line is increased by increasing a screen size of the display device and a resolution, RC delay is prevented.

Also, the guard ring 150 includes the island Ir defined by the second contour line L2 to increase a contact area between the guard ring 150 and the base substrate 101. Therefore, the contact stability between the guard ring 150 and the base substrate 101 may be improved.

In FIGS. 4 and 5, the guard ring 150 includes the seed layer 151 and the conductive layer 152. Alternatively, the guard ring 150 may have a multilayer structure having more than two layers.

In FIGS. 3 to 5, the guard ring 150 has the above-mentioned island structure. It will be understood that the above-mentioned island structure may be used for other lines.

For example, when the switching element TFT (shown in FIG. 1) has a bottom gate structure, the gate electrode G of the switching element TFT is formed on the base substrate 101, and the gate line 130 electrically connected to the gate electrode G may have the above-mentioned island structure. Also, the signal line formed from the same layer as the gate line may have the above-mentioned island structure. Alternatively, when the switching element TFT has a top gate structure, the source electrode S and the drain electrode D of the switching element TFT are formed on the base substrate 101, and the source line 140 electrically connected to the source drain electrode S may have the above-mentioned island structure. Also, the signal line formed from the same layer as the source electrode S may have the above-mentioned island structure.

Figure 6:
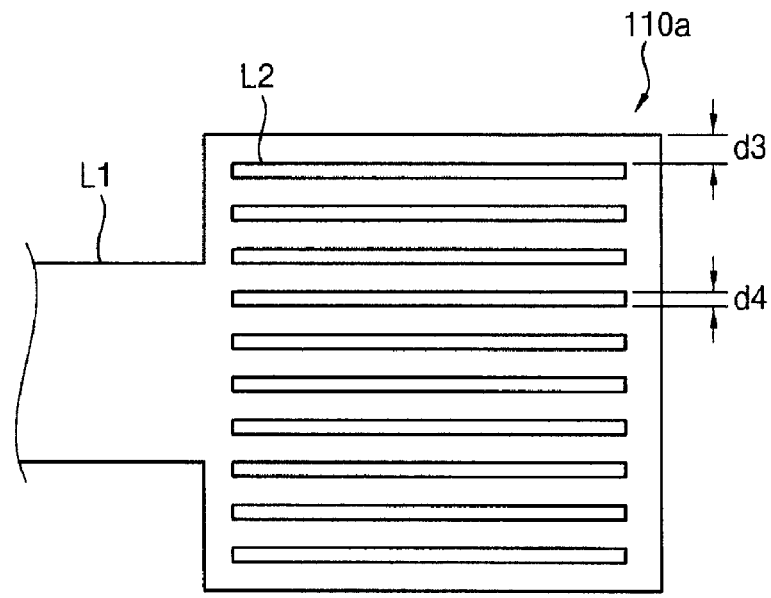
FIG. 6 is a plan view illustrating a gate pad formed in a portion 'B' of FIG. 1.

FIG. 6 is a plan view illustrating a gate pad formed in a portion 'B' of FIG. 1.

Referring to FIG. 6, the gate pad 110a is defined in a region between the first contour line L1 and the second contour line L2 formed as slits in the region defined by the first contour line L1.

The second contour line L2 may extend in a direction substantially parallel to the gate line. Alternatively, the second contour line L2 may extend in a direction substantially perpendicular to the gate line.

The gate pad 110a may have substantially the same island shape as shown in FIG. 4. For example, the second contour line L2 may correspond to the island Ir of FIG. 4, and the seed layer and the conductive layer may be formed in a region defined between the second contour line L2 and the first contour line L1.

Thus, an adhesive strength between the gate pad 110a and the base substrate 101 is increased, so that a stability of the gate pad 110a may be improved.

The gate pad 110a of FIG. 6 corresponds to the gate pad 110 of the bottom gate type. When the LCD panel of FIG. 1 includes the switching element TFT of the top gate type, the gate pad 110a of FIG. 6 may have substantially the same structure as the source pad of FIG. 1.

Figure 7:
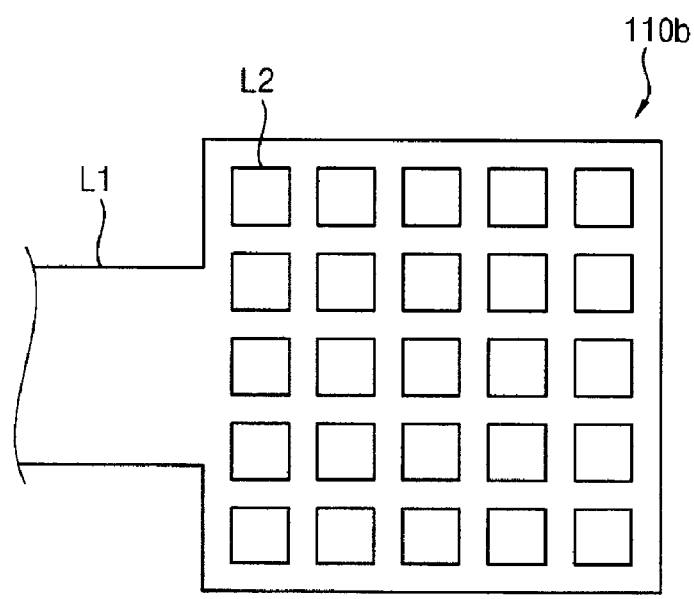
FIG. 7 is a plan view illustrating a gate pad in accordance with another embodiment of the present invention.
Figure 8:
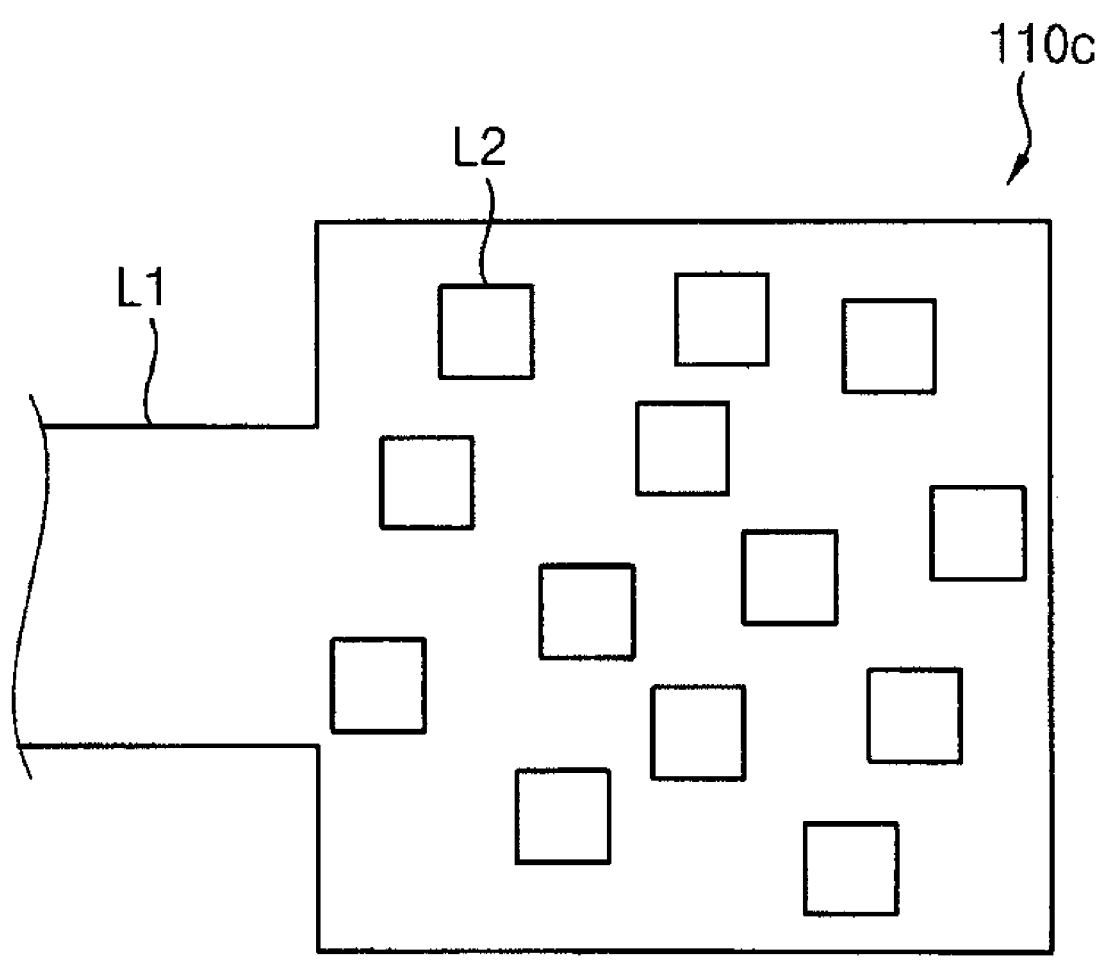
FIG. 8 is a plan view illustrating a gate pad in accordance with still another embodiment of the present invention.

FIG. 7 is a plan view illustrating a gate pad in accordance with another embodiment of the present invention. FIG. 8 is a plan view illustrating a gate pad in accordance with still another embodiment of the present invention. The gate pad of FIGS. 7 and 8 is same as that of FIG. 6 except for the shape of the an island defined by the second contour line L2 and the arrangement of the islands. Thus, the same reference numerals will be used to refer to the same or like parts as those described in FIG. 6 and any repetitive explanation concerning the above elements will be omitted.

Referring to FIGS. 7 and 8, the island shape defined by the second contour line L2 has a rectangular shape. In FIG. 7, the island shape defined by the second contour line L2 has a uniform arrangement. In FIG. 8, the island shape defined by the second contour line L2 may have a different arrangement, for example an irregular or random arrangement.

In FIGS. 7 and 8, the island defined by the second contour L2 has a rectangular shape. Alternatively, the island defined by the second contour line L2 may have other shapes.

Figure 9:
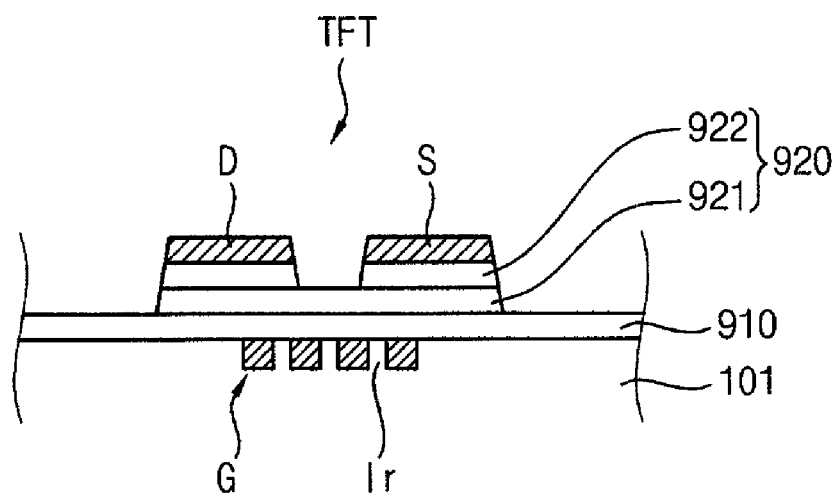
FIG. 9 is a cross-sectional view illustrating a switching element formed in a portion 'C' of FIG. 1.

FIG. 9 is a cross-sectional view illustrating a switching element formed in a portion 'C' of FIG. 1. In FIG. 9, the switching element TFT has a bottom gate structure.

Referring to FIG. 9, a gate electrode G that does not include an island pattern is formed in a trench of a base substrate 101. The gate electrode G may include the seed layer 151 (shown in FIGS. 4 and 5). In FIG. 9, the island pattern is formed on a portion of a line pattern having a width of more than about 300 μm. Examples of the line pattern having the island pattern may include a guard ring, a signal line, etc. The island pattern of the line pattern prevents the line pattern from lifting off. For example, a gate line and a gate electrode G may not have the island pattern or a slit.

An insulating layer 910 is formed on the base substrate 101 having the gate electrode G to cover the gate electrode G. Examples of an insulating material that may be used for the insulating layer 910 may include silicon nitride, silicon oxide, etc.

A semiconductor layer 920 is formed on the insulating layer 910. The semiconductor layer 920 includes an active layer 921 and an ohmic contact layer 922. The active layer 921 may include amorphous silicon (a-Si), and the ohmic contact layer 922 may include n+ amorphous silicon (n+ a-Si) that is implanted by impurities at a high concentration.

A drain electrode D and a source electrode S are formed on the ohmic contact layer 922 and partially overlap the gate electrode G.

Figure 10:
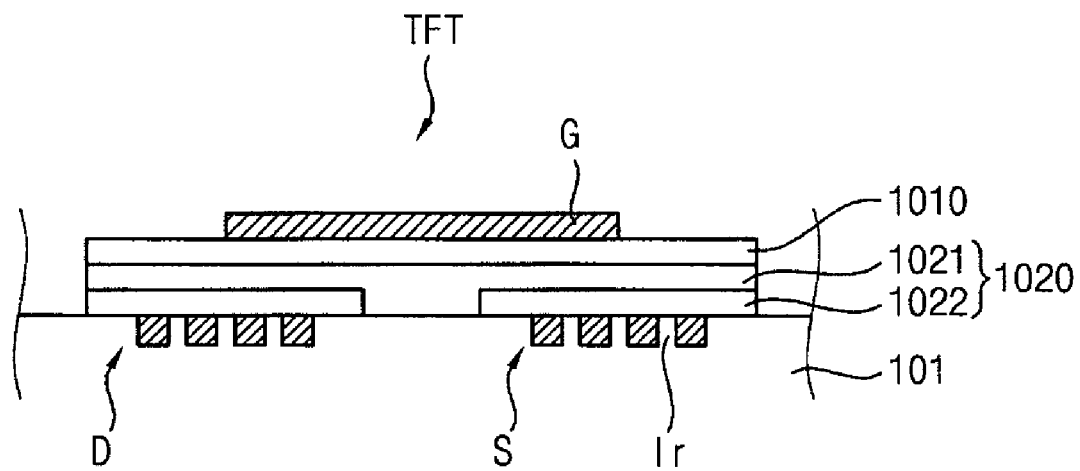
FIG. 10 is a cross-sectional view illustrating a switching element in accordance with another embodiment of the present invention.

FIG. 10 is a cross-sectional view illustrating a switching element in accordance with another embodiment of the present invention. In FIG. 10, the switching element TFT has a top gate structure.

Referring to FIG. 10, a drain electrode D and a source electrode S that is spaced apart from the drain electrode D are formed in trenches of a base substrate 101. In FIG. 10, a source line, the drain electrode D and the source electrode S that are formed in a display region do not have an island structure or a slit.

A semiconductor layer 1020 is formed on the base substrate 101 having the drain electrode D and the source electrode S. The ohmic contact layer 1022 includes two patterns on the semiconductor layer 1020. The two patterns of the ohmic contact layer 1022 are spaced apart from each other and are on the drain electrode D and the source electrode S, respectively.

The active layer 1021 covers a portion of the base substrate 101 that is exposed between the ohmic contact layer 1022, the drain electrode D and the source electrode S that are formed on the base substrate 101.

A gate electrode G is formed on the insulating layer 1010 which overlays the active layer 1021 and partially overlaps with the drain electrode D and the source electrode S.

FIGS. 11A to 11F are cross-sectional views illustrating processes for forming the guard ring shown in FIG. 4.

Figure 11A:
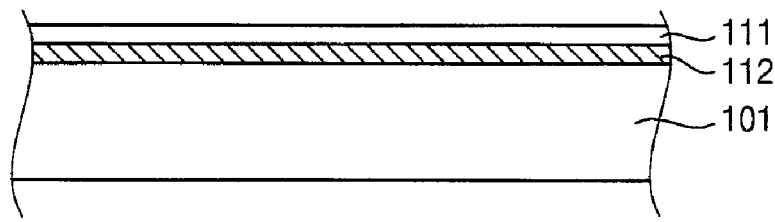
FIGS. 11A to 11F are cross-sectional views illustrating processes for forming the guard ring shown in FIG. 4.

Referring to FIG. 11A, a blocking layer 112 is formed on a base substrate 101, and a photoresist film 111 is formed on the blocking layer 112. The blocking layer 112 may include metal. For example, the blocking layer 112 may include molybdenum (Mo). The blocking layer 112 is resistant against fluorine, hydrogen fluoride (HF), etc.

Figure 11B:
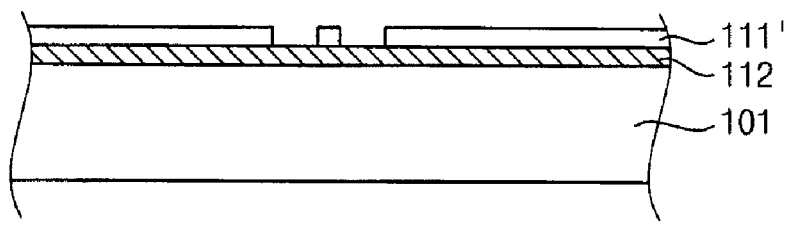

Referring to FIG. 11B, the photoresist film 111 is patterned through the photolithography process using the mask 200 shown in FIG. 2 to form a photoresist pattern 111'.

Figure 11C:
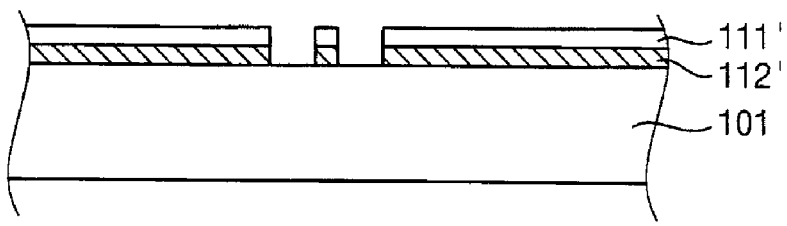

Referring to FIG. 11C, the blocking layer 112 is etched using the photoresist pattern 111' as an etching mask to form a blocking pattern 112'. For example, the blocking pattern 112' may be formed through a wet etching process.

Figure 11D:
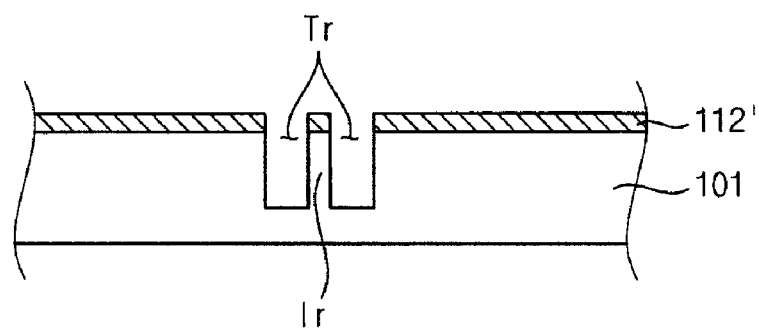

Referring to FIG. 11D, the photoresist pattern 111' is removed, and the base substrate 101 is etched using the blocking pattern 112' to form a trench Tr. For example, the base substrate 101 may be etched using the hydrogen fluoride that may etch glass or quartz.

When the photoresist pattern 111' has the resistance against the fluorine and the hydrogen fluoride, the step for forming the blocking pattern 112' may be omitted, and the trench may be directly formed on the base substrate 101 using the photoresist pattern 111' having a resistance against fluorine and hydrogen fluoride.

Figure 11E:
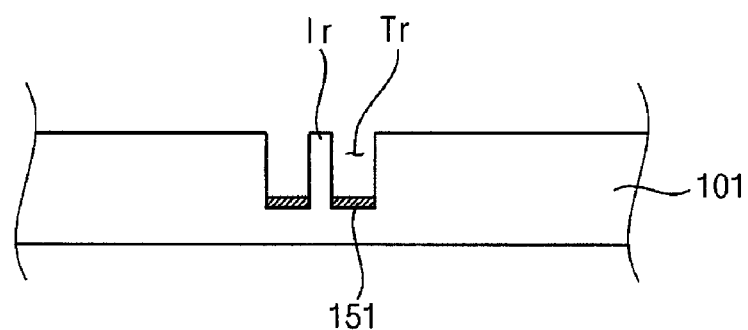

Referring to FIG. 11E, the blocking pattern 112' is removed, and a seed layer 151 is formed in the trench Tr of the base substrate 101. Examples of a seed material that may be used for the seed layer 151 include copper (Cu), molybdenum (Mo), titanium (Ti), titanium oxide (TiO), tantalum (Ta), etc. Alternatively, the seed layer 151 may include metal nitride, metal oxide, etc. For example, the seed layer 151 may include molybdenum nitride (MoN), titanium nitride (TiN), tantalum nitride (TaN), etc. The seed layer 151 may be formed through a chemical vapor deposition (CVD) method, a vacuum deposition method, a physical deposition method such as a sputtering deposition method, etc.

Figure 11F:
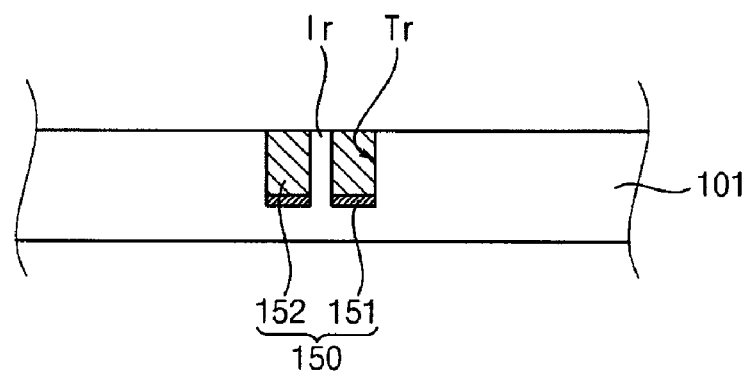

Referring to FIG. 11F, a conductive layer 152 is formed in the trench Tr of the base substrate 101 to form a guard ring 150. The conductive layer 152 may be formed through an ELP method. In the ELP method, deposition speed is high, and electric characteristics of a metal pattern are excellent. For example, the ELP method may have a low resistance of about 1.8 μΩcm and a high deposition speed of more than about 200 nm/min. Thus, the line pattern formed through the ELP method has better electric characteristics than the line pattern formed through a dry deposition method. In the ELP method, an organic material may be introduced into an electrolyte, so that the trench may be completely filled through a bottom-up filling method.

A gas generated during the ELP method is exhausted along a side surface of the trench of the base substrate. When a distance between the side surface and a center of the trench is large, the gas may not be exhausted. However, in FIG. 11F, the island Ir formed in the trench decreases the distance between the side surface and the center of the trench, so that a path length of exhausting the gas is decreased. Thus, the gas may be easily discharged.

Therefore, the conductive layer 152 may not be lifted off from the trench. Also, the island Ir increases the contact area between the conductive layer 152 and the base substrate 101, so that the conductive layer 152 may be securely attached to the base substrate 101.

In FIGS. 11A to 11F, the island Ir is formed in the guard ring 150 on the base substrate 101. It will be understood that the above-mentioned island structure may be used for a first line layer formed on the base substrate 101. For example, when the switching element has a bottom gate structure, the first line may include signal lines, a gate electrode, a gate line, a gate pad, etc. When the switching element has a top gate structure, the first line may include a drain electrode, a source electrode, a source line, a source pad, etc.

Although only the first line has the above-mentioned island structure, the island structure having the first contour line and the second contour line in the first contour line may be used for various line patterns.

The embodiments disclose the LCD panel. Alternatively, the display substrate of the present invention may also be used for another flat display panel device such as a plasma display panel (PDP) device, a field emission display (FED) device, an organic light-emitting diode (OLED) display device, etc.

According to the present invention, gas generated during forming of a line pattern may be easily discharged to prevent lifting off of the line pattern from a substrate and to increase the contact area between the line pattern and the substrate so as to improve the stability of the line pattern.

This invention has been described with reference to the example embodiments. It is evident, however, that many alternative modifications and variations will be apparent to those having skill in the art in light of the foregoing description. Accordingly, the present invention embraces all such alternative modifications and variations as falling within the spirit and scope of the appended claims.

What is claimed is:

1. A display substrate comprising:
    a base substrate including a trench pattern formed between a first contour line and at least one second contour line formed in a region defined by the first contour line;
    a first line layer in the trench pattern of the base substrate;
    an insulating layer on the base substrate having the first line layer to cover the first line layer;
    a second line layer on the insulating layer;
    a TFT on the base substrate and electrically connected to the first line layer and the second line layer; and
    a pixel electrode on the base substrate electrically connected to the TFT.

2. The display substrate of claim 1, wherein the first line layer comprises copper, silver or an alloy thereof.

3. The display substrate of claim 2, wherein the first line layer comprises:
    a seed layer on an inner surface of the trench; and
    a conductive layer on the seed layer.

4. The display substrate of claim 3, wherein the seed layer comprises at least one selected from the group consisting of copper (Cu), molybdenum (Mo), titanium (Ti), titanium oxide (TiO), tantalum (Ta), an oxide thereof and a nitride thereof.

5. The display substrate of claim 1, wherein the first line layer comprises a gate pad in a peripheral region of the base substrate and a gate line electrically connected to the gate pad, and the second line layer includes a source pad in the peripheral region and a source line electrically connected to the source pad.

6. The display substrate of claim 5, wherein the first line layer is opposite to the gate pad, and further comprises a guard ring electrically connected to a plurality of gate lines.

7. The display substrate of claim 1, wherein a distance between the first contour line and the second contour line is no more than about 200 μm.

8. The display substrate of claim 7, wherein a depth of the trench is no more than about 5,000 Å.

9. The display substrate of claim 7, wherein a plurality of second contour lines having a plurality of slit shapes arranged substantially in parallel with each other is formed in the first contour line defining the gate pad, and the slit shapes expose the base substrate.

10. The display substrate of claim 9, wherein a width of each of the second contours defining the slit shapes is about 20 μm, and a distance between adjacent second contours is about 40 μm.

11. The display substrate of claim 1, wherein the first line layer comprises a source pad in the peripheral region, and
the second line layer includes a gate pad in the peripheral region.

12. The display substrate of claim 11, wherein the first contour line defines a shape of the source pad, and
the second contour line is extended in a direction substantially parallel with the source line and exposes the base substrate in the source pad along the source line.

13. The display substrate of claim 12, wherein a width of each of the second contour lines is about 20 μm, and a distance between adjacent second contour lines is about 40 μm.

* * * * *